United States Patent [19]

Defranould

[11] 4,129,798

[45] Dec. 12, 1978

[54] PIEZO-RESISTIVE DEVICE FOR THE ELECTRICAL READ-OUT OF AN OPTICAL IMAGE

[75] Inventor: Philippe Defranould, Paris, France

[73] Assignee: Thomson-CSF, Paris, France

[21] Appl. No.: 786,863

[22] Filed: Apr. 12, 1977

[30] Foreign Application Priority Data

Apr. 16, 1976 [FR] France .............................. 76 11445

[51] Int. Cl.² ............................................ H01L 41/10
[52] U.S. Cl. ...................................... 310/313; 357/26
[58] Field of Search .............. 310/313; 357/26, 29–31, 357/41; 333/30 R, 72

[56] References Cited

U.S. PATENT DOCUMENTS

| | | | |
|---|---|---|---|
| 3,691,406 | 9/1972 | Mize | 357/26 X |
| 3,792,321 | 2/1974 | Seifert | 357/26 |
| 3,903,406 | 9/1975 | London | 310/313 X |
| 3,935,564 | 1/1976 | Quate | 357/26 X |
| 3,970,778 | 7/1976 | Adkins | 357/26 X |
| 4,012,586 | 3/1977 | Roos | 310/313 X |
| 4,028,565 | 6/1977 | Davis | 357/30 X |
| 4,028,719 | 6/1977 | Curtis | 357/30 |
| 4,047,214 | 9/1977 | Francombe et al. | 357/26 X |

*Primary Examiner*—Mark O. Budd
*Attorney, Agent, or Firm*—Roland Plottel

[57] ABSTRACT

The device comprises a silicon substrate, means for generating a pulse elastic wave at the surface of the substrate on to which the image for read-out is projected, and elementary detectors detecting the conductivity of the substrate. Each of the detectors is constituted, in one embodiment, by two conductive bands arranged at a short interval from one another, perpendicularly to the direction of propagation of the elastic wave; a potential difference is applied between the conductive bands. The elementary detectors then sequentially furnish an electrical signal resulting at each point on the substrate from the superimposition on the one hand of the conductivity due to the image by photoelectric effect, and on the other of the conductivity due to the elastic wave by piezo-resistive effect.

11 Claims, 8 Drawing Figures

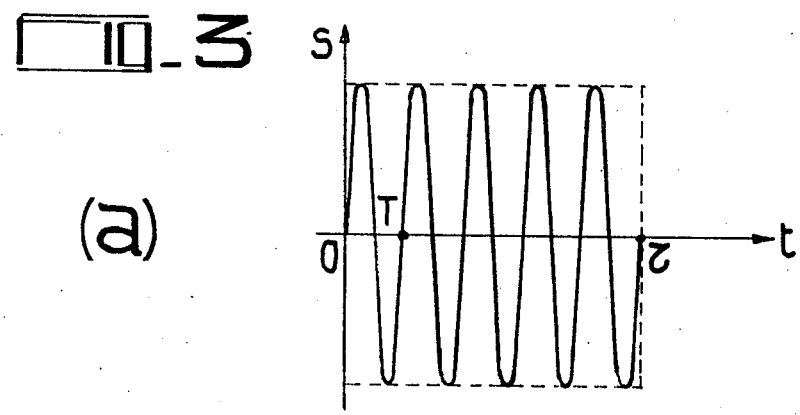
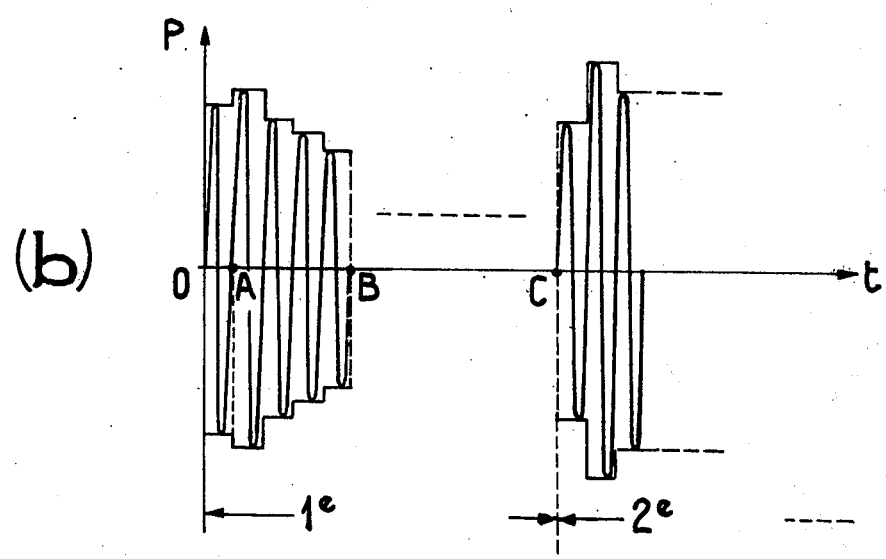
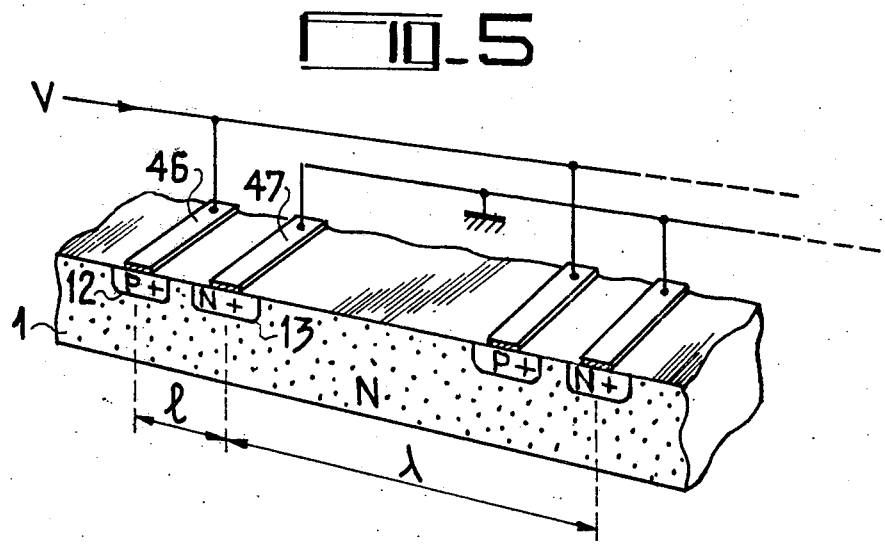

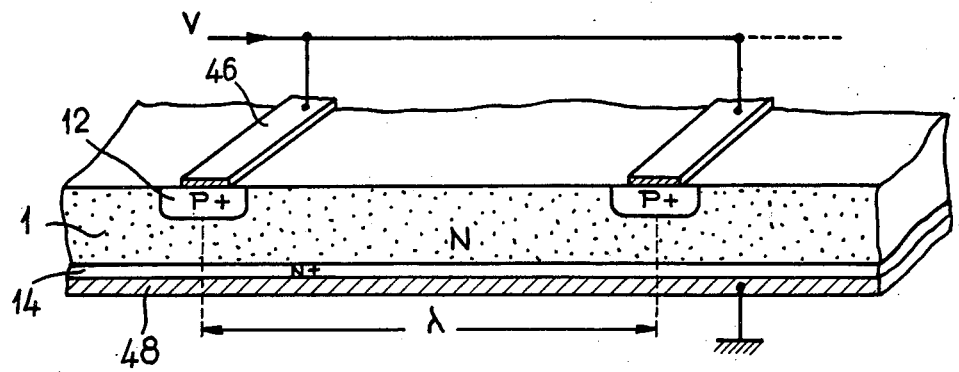
_FIG_6
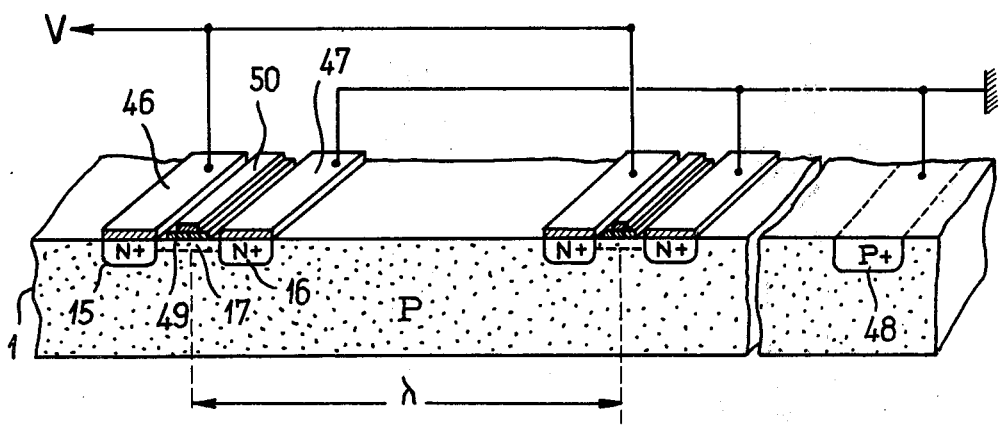
_FIG_7

PIEZO-RESISTIVE DEVICE FOR THE ELECTRICAL READ-OUT OF AN OPTICAL IMAGE

The present invention relates to the electrical read-out of an optical image. It relates more particularly to a device which, for this purpose, makes use of the piezo-resistive effect.

Those skilled in the art will recall that the piezo-resistive effect occurs in certain solids and consists in a modification of the resistivity of the material under the effect of mechanical stress.

Various known devices utilise this effect, in particular in order to detect an elastic wave or again to sequentially read-out by scanning operation, a piece of electrical information presented by a network of pick-ups, as described in U.S. application Ser. No. 535,714 to THOMSON-CSF.

The present invention relates to the utilisation of the piezo-resistive effect in order to read-out optical images.

According to the invention, there is provided a piezo-resistive device for the electrical read-out of an optical image, which comprises: a piezo-resistive and photoconductive substrate; means for generating a pulse elastic wave of frequency F, propagating at the surface of the substrate; a plurality of elementary detectors arranged in rows parallel to the direction of propagation of the elastic wave, on a surface of the substrate refered to as the interaction surface, on to which surface said image is projected, said elementary detectors each furnishing an electrical signal representing the local conductivity of said substrate due to the combined effect of said elastic wave, through the piezo-resistive effect, and of the optical energy of said image, through the photoconductive effect.

For a better understanding of the invention and to show how it may be carried into effect, reference will be made to the following description given by way of example and illustrated by the attached figures in which.

Figure 1:
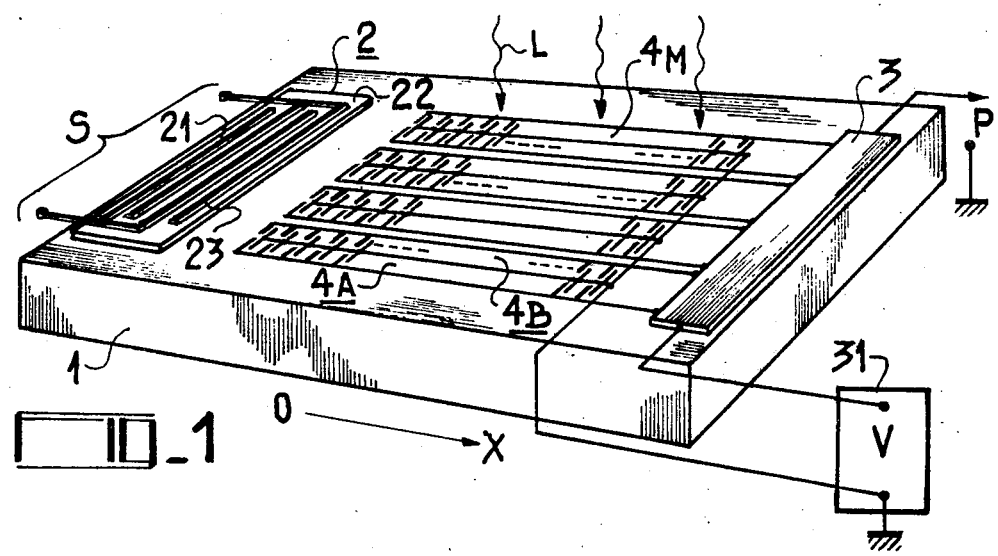
FIG. 1 is a schematical view of an embodiment of the device in accordance with the invention.
Figure 4:
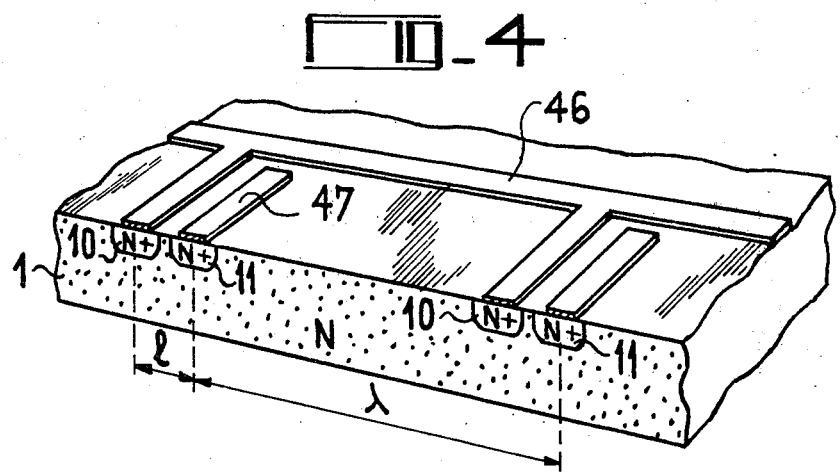

FIGS. 3, a and b, are diagrams representing signals applied to the device in accordance with the invention or produced by it;

FIG. 4 is a partially sectioned view of FIG. 1;

FIGS. 5 and 6 are variant embodiments of the device in accordance with the invention, in which the elementary detectors are formed by means of PN junctions;

FIG. 7 is a variant embodiment of the device in accordance with the invention in which the elementary detectors are created in the form of MOS or MIS structures.

In these various figures, similars references relate to similar elements.

In FIG. 1, a piezo-resistive and photoconductive substrate 1 made of silicon, germanium or gallium arsenic (GaAs) has been shown, upon which there are arranged:

means (2) for generating an elastic wave at the surface of the substrate 1, the wave being propagating in a direction $\vec{Ox}$;

elementary detectors arranged in M rows, each row being parallel to Ox, and marked $4_A, 4_B, \ldots 4_M$.

The means 2 for generating elastic waves are constituted in the embodiment shown in the figure, by a thin layer 22 of piezo-electric material, for example zinc oxide (ZnO), deposited upon the substrate 1, and by two electrodes 21 and 22 of interleaved comb design. The application of an electrical signal S to the terminals of the electrodes 21 and 23 gives rise to the creation of an elastic wave by piezo-electric effect, this wave also being referred to as an acoustic wave, which propagates at the surface of the substrate 1 in a direction $\vec{Ox}$ normal to the teeth of the comb electrodes 21 and 23.

In other embodiments, not shown in in the figures, the means for generating an elastic wave can take the form described in the aforementioned U.S. Pat. Ser. No. 534,714 or again be constituted by a piezo-electric plate covered with an electrode on each of its faces and applied, through the medium of one of its electrodes, against a face of the substrate 1, which is normal to the axis Ox.

Figure 2:
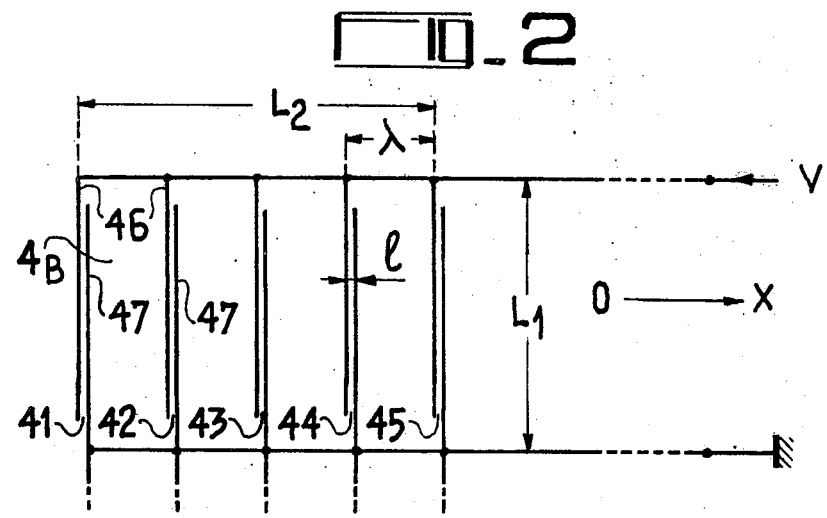
FIG. 2 is a detail from the preceding figure.

In the embodiment shown in FIG. 1, the elementary detectors are constituted in each case by two parallel electrodes as shown on a larger scale in FIG. 2. This figure represents five elementary detectors (41, 42, 43, 44 and 45) of the row $4_B$, each constituted by two electrodes (46 and 47), perpendicular to the direction Ox and separated by an interval l very much shorter than the wavelength λ of the elastic wave propagating in the direction Ox; typically, l may be of the order of λ/5. The electrodes 46 of the detectors are connected together to form a comb and are connected through the medium of a circuit 3 to a source 31 producing a potential V (FIG. 1). The electrodes 47 similarly form a comb which is maintained at the reference potential. Preferably, the electrodes will be made of a transparent or semi-transparent (polycrystalline silicon for example) conductive material, facilitating optical access to the sensitive surface.

The detectors 41 . . . 45 are separated from one another by a constant interval equal to λ as shown in FIG. 2, or to a multiple of λ, in order to satisfy the phase conditions for the elementary detection operations.

The image to be read out is projected on to the surface of the substrate 1 which carries the M rows of detectors, that surface being known as the interaction surface, that being symbolized by the arrows L.

The output signal P is furnished by the circuit 3.

The device in accordance with the invention operates in the following manner. The image to be read out (L) is projected on to the subsrate 1. The conductivity of the substrate thus is spatially modulated by the photoelectric effect as a function of the luminous intensity at each point. In addition, an elastic wave marked S like the electrical signal which produces it, is generated by the element 2 at the surface of the substrate 1, the wave S being a sinusoidal wave of frequency F, periodicity T and pulse type, the pulse duration being τ, as shown in FIG. 3a. This elastic wave S in turn modulates the conductivity of the substrate.

It will be remembered that the piezo-resistive effect consists of a modification in the conductivity of the substrate under the effect of mechanical stress. If there is a current I flowing through an elementary detector in the absence of the elastic wave S, the passage of the wave S will be translated into terms of a modulation of this current, the amplitude of whose component at the frequency F, can be written:

$$i = I \cdot G \cdot (2\pi \cdot F \cdot p)^{\frac{1}{2}} \tag{1}$$

where G is the gauge factor characteristic of the material of which the substrate is made and p is the power density of the surface elastic wave.

The elementary detectors are connected to the terminals of a voltage source V and, more specifically, the electrode 46 is connected to the negative terminal when the substrate 1 is of N-type material. The detectors thus make it possible to measure the conductivity which, on passage of the wave, results from the modulation due on the one hand to the elastic wave S itself and on the other to the projected image L.

In other words, when the current I is a photo-current which is a function of the illuminating power J, neglecting the dark current, we have $I = \alpha\ VJ$, where $\alpha$ is a proportionality coefficient depending in particular upon the material of which the substrate is made. In the expression (1), the value of the current i furnished by a detector at the frequency F, is thus;

$$i = VJ \cdot G \cdot (2\pi \cdot F \cdot p)^{\frac{1}{2}} \qquad (2)$$

FIG. 3b illustrates the wave-form of the electrical signal P which it is possible to obtain after this kind of scan by the pulse S. The signal P appears at the output of the circuit 3 which eliminates the polarisation V from the output signal, about the frequency F.

The signal P occurs in the form of a signal of periodicity T (that of the elastic wave S) modulated by a step curve whose step duration (OA, for example) corresponds to the propagation time of the elastic wave from one elementary detector to the next (from 41 to 42 in FIG. 2 for example). In the case where the interval between two detectors is equal to the wavelength $\lambda$ of the elastic wave, this duration is equal to the periodicity T of the signal S.

If the elastic wave S has a duration $\tau = kT$, the signal P represents the integration of the information over k elementary detectors (still considering the case in which these latter are spaced at $\lambda$) and an "image point" can be defined by k detectors. In the figures, in particular FIGS. 2 and 3a, the case has been shown in which k = 5 and the extent of an image point has been indicated: length $L_2 = k \cdot \lambda$ and width $L_1$, preferably equal to $L_2$. If each row of $(4_A \ldots 4_M)$ is constituted by n elementary detectors, the image is defined by $N = n/k$ points per row.

Returning again to FIG. 3b, the length OB corresponds to a duration $\tau(=kT)$ and the length OC to a duration $N \cdot \tau$, that is to say to the time taken by the elastic wave to scan a row.

Everything that has been said before relates to a single row, that is to say that the circuit 3 (FIG. 1) makes it possible to obtain a signal furnished by a single one of the rows $4_A \ldots 4_M$, during the scanning time N.

In practice, switching from one row (4) to another can be performed either by the circuit 3, or, and this is preferable, at the point where the electrodes are supplied with the direct voltage V, or, alternatively, at the point where the signals of frequency F occur.

At the end of the time $N \cdot \tau$, another train of elastic waves of duration $\tau$ is emitted by the element 2 and the circuit 3 furnishes the signal obtained from a following row.

FIG. 4 illustrates in section an embodiment of the device shown in FIG. 1.

In this embodiment, the substrate 1 is N-type silicon and comprises $N^+$-doped bands 10 and 11 located beneath the electrodes 46 and 47 respectively, in order to facilitate electrical contact between the substrate 1 and these electrodes.

The electrodes 46 and 47 are arranged upon the substrate 1 in the manner shown in FIGS. 1 and 2.

FIG. 5, in section, illustrates a variant embodiment of the device in accordance with the invention, in which the elementary detectors are constituted by PN junctions.

In this embodiment, the substrate 1 is for example N-type material. It comprises bands 12 and 13 whose conductivity differs from that of the substrate, which extend beneath the electrodes 46 and 47 respectively, these latter being arranged in a manner shown in FIGS. 1 and 2.

As before, the bands beneath the electrode 47, now marked 13, are $N^+$-doped.

The bands 12 located beneath the electrodes 46 are $P^+$-doped and connected to the negative terminal of the voltage source 31 shown in FIG. 1. Thus, at the $P^+N^+$ junction (zone 12 to zone 13) a depletion zone develops in which a majority charge carrier depletion occurs and where the conductivity modulation effects described earlier have specially marked results.

As in the case of FIG. 4, the bands (12 and 13) located beneath the electrodes are highly doped in order to facilitate electrical contact.

Still in section, FIG. 6 illustrates a variant embodiment of the preceding figure, in which the elementary detectors are again constituted by PN junctions although one of the zones is constituted by the substrate 1 itself.

Thus, in FIG. 6 we see the substrate 1, for example of N-type material, on whose interaction surface the electrode 46 is arranged, which is connected to the potential V by means of the circuit S and, beneath the electrode 46, the $P^+$-doped band 12. The other part of the junction is constituted by the substrate 1 whose bottom face, that not supporting the electrode 46, is covered by a flat electrode 48 maintained at the reference potential.

As before, the electrical contact between substrate (1) and electrode (48) may be improved by a zone 14 of higher conductivity, that is to say $N^+$-doped zone extending beneath the electrode 48.

FIG. 7 illustrates a variant embodiment of the device in accordance with the invention in which the elementary detectors are formed by means of MOS (metal oxide semiconductor) or MIS (metal insulator semiconductor) structures.

In this figure, there can be seen the substrate 1, here of P-type material for example, whose interaction surface carries the network of electrodes 46 supplied with potential V by means of the circuit 3 and the network of electrodes 47 maintained at the reference potential through the medium of a $P^+$-doped zone 48. Beneath the electrode 47 the substrate 1 comprises bands 15 and 16 $N^+$-doped, which respectively constitute the sources and drains of MOS transistors. The electrodes 46 and 47 are separated at the surface of the substrate by an insulating layer 49 carrying an electrode 50 which constitues the gate of the MOS transistors.

When the gate 50 of the transistors is positively biased, then conventionally an inversion zone 17 (N-type channel) develops, making it possible to detect the aforementioned conductivity modulations.

It should be noted that positive biasing of the gate 50 can be dispensed with in certain situations if electrical charges are present at the interface between the insulator (49) and the semiconductor (1), these charges can then spontaneously create the inversion zone 17.

What is claimed is:

1. A piezo-resistive device for the electrical read-out of an optical image, which comprises:
   a piezo-resistive and photoconductive substrate;
   means for generating a pulse elastic wave of frequency F, propagating at the surface of the substrate;
   a plurality of elementary detectors arranged in rows parallel to the direction of propagation of the elastic wave, on a surface of the substrate refered to as the interaction surface, on to which surface said image is projected, said elementary detectors each furnishing an electrical signal representing the local conductivity of said substrate due to the combined effect of said elastic wave, through the piezo-resistive effect, and of the optical energy of said image, through the photoconductive effect.

2. A device as claimed in claim 1, wherein said elementary detectors are spaced from one another by a distance equal to the wavelength of the elastic wave, or to a multiple thereof.

3. A device as claimed in claim 1, wherein each of said elementary detectors comprises a first and a second electrodes, parallel to one another, spaced by an interval smaller than a quarter of the wavelength of the elastic wave, said first and second electrodes being substantially normal to said direction of propagation of the elastic wave, said device further comprising means for supplying a potential difference between said first and second electrodes.

4. A device as claimed in claim 3, wherein said elementary detectors are arranged in rows, said first electrodes of one and the same row being connected together to form a first comb structure and said second electrodes likewise to form a second comb structure which is interleaved with said first comb structure.

5. A device as claimed in claim 4, wherein that of said comb structure whose potential is chosen as a reference potential is common to two adjacent rows.

6. A device as claimed in claim 1, wherein each of said elementary detectors comprises a PN junction comprising two zones of opposite conductivity formed on said interaction surface, said junction being reverse-biased by means of two electrical contacts placed upon said interaction surface.

7. A device as claimed in claim 1, wherein each of said elementary detectors comprises a PN junction comprising a zone whose conductivity is the opposite of that of the substrate at said interaction surface, said junction being reverse-biased by means of an electrical contact arranged on said zone, and of an electrode common to all the elementary detectors, arranged on that surface of the substrate which is opposite to said interaction surface.

8. A device as claimed in claim 1, wherein each of the detectors is constituted by an MIS or MOS type field-effect transistor, comprising upon said interaction surface two zones of opposite conductivity to that of the substrate, separated by a gate arranged upon an insulating layer which is arranged upon the substrate.

9. A device as claimed in claim 1, further comprising a circuit which sequentially selects said rows, switching of the rows being performed synchronously with the emission of said elastic wave.

10. A device as claimed in claim 1, wherein said elastic wave has a duration long enough to simultaneously cover several elementary detectors on said interaction surface.

11. A device as claimed in claim 1, wherein said substrate is constituted by silicon, germanium or gallium-arsenide.

* * * * *